(12) United States Patent
Cho et al.

(10) Patent No.: US 11,562,596 B2
(45) Date of Patent: Jan. 24, 2023

(54) OPTICAL FINGERPRINT SENSOR, PREPARATION METHOD THEREOF, AND DISPLAY DEVICE

(71) Applicants: BEIHAI HKC OPTOELECTRONICS TECHNOLOGY CO., LTD., Beihai (CN); HKC CORPORATION LIMITED, Shenzhen (CN)

(72) Inventors: En-tsung Cho, Beihai (CN); Fengyun Yang, Beihai (CN); Je-hao Hsu, Beihai (CN); Haijiang Yuan, Beihai (CN)

(73) Assignees: BEIHAI HKG OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 64 days.

(21) Appl. No.: 17/218,481

(22) Filed: Mar. 31, 2021

(65) Prior Publication Data

US 2022/0036031 A1    Feb. 3, 2022

(30) Foreign Application Priority Data

Jul. 28, 2020  (CN) .......................... 202010735668.6

(51) Int. Cl.
| H01L 29/786 | (2006.01) |
| G06V 40/13 | (2022.01) |
| G02F 1/1333 | (2006.01) |
| H01L 27/146 | (2006.01) |

(52) U.S. Cl.
CPC ...... *G06V 40/1318* (2022.01); *G02F 1/13338* (2013.01); *H01L 27/14623* (2013.01); *H01L 27/14643* (2013.01); *H01L 27/14678* (2013.01); *H01L 27/14685* (2013.01); *H01L 27/14689* (2013.01)

(58) Field of Classification Search
CPC ............ G06V 40/1318; G02F 1/13338; H01L 27/14623; H01L 27/14643; H01L 27/14678; H01L 27/14685; H01L 27/14689; H01L 27/1214; G02B 27/30
USPC .......................................................... 257/59
See application file for complete search history.

(56) References Cited

U.S. PATENT DOCUMENTS

| 2013/0082267 A1* | 4/2013 | Aichi | ................... H01L 27/1214 257/59 |
| 2019/0347462 A1* | 11/2019 | Tseng | ..................... G02B 27/30 |
| 2020/0395433 A1* | 12/2020 | Sung | ................... G06V 40/1318 |

* cited by examiner

*Primary Examiner* — Abdul-Samad A Adediran
(74) *Attorney, Agent, or Firm* — Westbridge IP LLC

(57) ABSTRACT

Disclosed are an optical fingerprint sensor, a preparation method thereof and a display device. The optical fingerprint sensor includes: a substrate; and a sensor unit, disposed on the substrate and including a thin film transistor and a photosensor electrically connected to the thin film transistor, where the thin film transistor includes a source electrode, a drain electrode, a semiconductor layer, and a light shield layer formed over a channel region between the source electrode and the drain electrode and shielding the semiconductor layer exposed in the channel region.

14 Claims, 5 Drawing Sheets

OPTICAL FINGERPRINT SENSOR, PREPARATION METHOD THEREOF, AND DISPLAY DEVICE

CROSS REFERENCE TO RELATED APPLICATIONS

The present disclosure claims the priority of Chinese Patent Application No. 202010735668.6, filed on Jul. 28, 2020 and entitled "Optical Fingerprint Sensor, Preparation Method Thereof, and Display Device", which is hereby incorporated by reference in its entirety.

TECHNICAL FIELD

This disclosure relates to the field of thin film transistor liquid crystal display technology, and in particular to an optical fingerprint sensor, a preparation method thereof, and a display device.

BACKGROUND

With the development of full-screen technology, in order to increase the screen ratio of terminals as much as possible, under-screen fingerprint unlocking technology has become a mainstream unlocking technology.

The optical fingerprint sensor is currently the most commonly used under-screen fingerprint sensor. However, when a conventional optical fingerprint sensor is used to prepare a display device with under-screen fingerprint detection function, in order to prevent the optical short circuit of the control element of the optical fingerprint sensor, an additional light shield layer is provided between the display module and the optical fingerprint sensor, and the relative position of the light shield layer and the optical fingerprint sensor needs to be accurately matched, which makes the manufacturing process of the display device very cumbersome.

The above content is only used to help understand the technical solution of this disclosure, and does not mean that the above content is recognized as prior art.

SUMMARY

The main object of this disclosure is to provide an optical fingerprint sensor, a preparation method thereof, and a display device, aiming to solve the problem that the preparation of a display device with under-screen fingerprint detection function is cumbersome because the additional light shield layer needs to be accurately matched with the optical fingerprint sensor.

To achieve the above object, this disclosure provides an optical fingerprint sensor, which includes:

a substrate; and a sensor unit, disposed on the substrate and including a thin film transistor and a photosensor electrically connected to the thin film transistor, where the thin film transistor includes a source electrode, a drain electrode, a semiconductor layer, and a light shield layer formed over a channel region between the source electrode and the drain electrode and shielding the semiconductor layer exposed in the channel region.

In an embodiment, a part of the source electrode and/or a part of the drain electrode is shielded by light shield layer.

In an embodiment, the light shield layer is made of metal.

In an embodiment, the light shield layer is prepared by a physical vapor deposition method.

In an embodiment, the optical fingerprint sensor further includes an insulation layer between the light shield layer and the semiconductor layer.

In an embodiment, the photosensor includes a lower electrode, a gate insulation layer, an electrode layer, a dielectric layer and a transparent conductive layer sequentially stacked on the substrate, where the transparent conductive layer is electrically connected to the lower electrode, and the electrode layer is electrically connected to the source electrode or the drain electrode of the thin film transistor.

In an embodiment, a part of the source electrode or a part of the drain electrode of the thin film transistor is extended above the lower electrode of the photosensor to be configured as the electrode layer of the photosensor.

In an embodiment, a material of the transparent conductive layer includes indium tin oxide.

In an embodiment, a material of the dielectric layer includes nitrogen-doped amorphous silicon.

In an embodiment, a material of the substrate includes glass.

In an embodiment, a thickness of the substrate is not greater than 1 mm.

In an embodiment, the optical fingerprint sensor further includes an insulation protective layer deposited on the light shield layer.

In order to achieve the above object, this disclosure further provides a preparation method of the above-mentioned optical fingerprint sensor. The preparation method of the optical fingerprint sensor includes:

providing a substrate;

forming a thin film transistor and a photosensor electrically connected to the thin film transistor on the substrate; and forming a patterned light shield layer, where a channel region between a source electrode and a drain electrode of the thin film transistor is shielded by the light shield layer.

In an embodiment, forming a thin film transistor and a photosensor electrically connected to the thin film transistor on the substrate includes:

forming a patterned first metal layer on the substrate, where a part of the first metal layer is configured as a gate electrode of the thin film transistor, and the other part of the first metal layer is configured as a lower electrode of the photosensor;

forming a gate insulation layer and a patterned semiconductor layer sequentially stacked on the gate insulation layer;

forming a second metal layer, and patterning the second metal layer to obtain the source electrode and the drain electrode, where the source electrode or the drain electrode is extended above the lower electrode to be configured as an electrode layer of the photosensor; and forming a patterned dielectric layer and a patterned transparent conductive layer sequentially stacked on the electrode layer, where the transparent conductive layer is covered on dielectric layer and connected to the lower electrode, the thin film transistor includes the gate electrode, the gate insulation layer, the semiconductor layer, the source electrode, and the drain electrode, and the photosensor includes the lower electrode, the gate insulation layer, the electrode layer, and the dielectric layer and the transparent conductive layer.

In order to achieve the above object, this disclosure further provides a display device, which includes a display panel and the optical fingerprint sensor described above arranged under the display panel.

In an embodiment, a substrate of the display panel is made of at least one of glass, polyimide and polyethylene naphthalate.

Some embodiments of this disclosure provide an optical fingerprint sensor including: a substrate; and a sensor unit, disposed on the substrate and including a thin film transistor and a photosensor electrically connected to the thin film transistor, where the thin film transistor includes a source electrode, a drain electrode, a semiconductor layer, and a light shield layer formed over a channel region between the source electrode and the drain electrode and shielding the semiconductor layer exposed in the channel region. Since the thin film transistor as the control element in the optical fingerprint sensor is already provided with a light shield layer, when a display device with an under-screen fingerprint detection function is prepared, no additional light shield layer is required, and the preparation process is simple.

Figure 1:
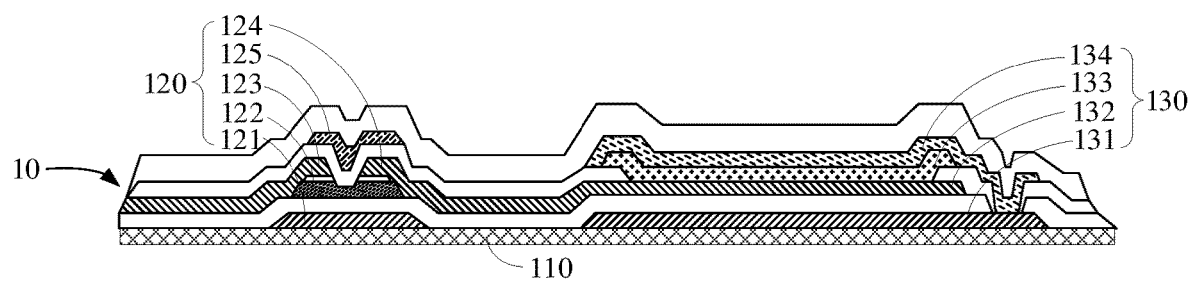
FIG. 1 is a schematic structural diagram of an optical fingerprint sensor according to an embodiment of this disclosure.

The realization of the object, functional characteristics, and advantages of this disclosure will be further described in conjunction with the embodiments and with reference to the accompanying drawings.

DETAILED DESCRIPTION OF THE EMBODIMENTS

The technical solutions in the embodiments of this disclosure will be described clearly and completely in conjunction with the drawings in the embodiments of this disclosure. Obviously, the described embodiments are only a part of the embodiments of this disclosure, but not all the embodiments. Based on the embodiments in this disclosure, all other embodiments obtained by those of ordinary skill in the art without creative work shall fall within the protection scope of this disclosure.

It should be noted that all directional indicators (such as up, down, left, right, front, back . . . ) in the embodiments of this disclosure are only used to explain the relative positional relationship, movement conditions, etc. among the components in a specific posture (as shown in the drawings), if the specific posture changes, the directional indicator also changes accordingly. In addition, the descriptions related to "first", "second", etc. in this disclosure are for descriptive purposes only, and cannot be understood as indicating or implying their relative importance or implicitly indicating the number of indicated technical features. Thus, the features defined as "first" and "second" may include at least one of the features either explicitly or implicitly. In addition, the technical solutions between the various embodiments can be combined with each other, but they must be based on the ability of those skilled in the art to realize. When the combination of technical solutions conflicts with each other or cannot be realized, it should be considered that the combination of such technical solutions does not exist, nor within the scope of protection required by this disclosure.

As shown in FIG. 1, an embodiment of this disclosure provides an optical fingerprint sensor 100 including: a substrate 110; and a sensor unit 10, disposed on the substrate 100 and including a thin film transistor 120 and a photosensor 130 electrically connected to the thin film transistor 120, where the thin film transistor 120 includes a source electrode 123, a drain electrode 124, a semiconductor layer 122, and a light shield layer 125 formed over a channel region 150 between the source electrode 123 and the drain electrode 124 and shielding the semiconductor layer 122 exposed in the channel region 150.

Specifically, the substrate 110 is made of glass with a thickness of 1 mm or less, and the substrate 110 is configured to provide a bearing and fixing platform for the sensor unit. Compared with the single crystal silicon substrate, the glass substrate 110 of the optical fingerprint sensor 100 is not only lower in cost, but also can be made thinner (a thickness of the substrate made of single crystal silicon is more than 3 mm, while a thickness of the glass substrate 110 provided by the embodiment of this disclosure may be less than 1 mm), and a thinner substrate is beneficial to reduce an overall thickness of the optical fingerprint sensor 100. The sensor unit 10 is disposed on the substrate 110. The sensor unit 10 includes a Thin Film Transistor (TFT) 120 and a photosensor 130 electrically connected to the thin film transistor 120. The photosensor 130 includes a photosensitive diode. The pin of the photosensor 130 is electrically connected to the source electrode 123 or the drain electrode 124 of the thin film transistor 120. The photosensor 130 is configured to absorb light radiation to generate a current when irradiated by light, and the generated current is conducted through the thin film transistor 120 and transmitted to a fingerprint identification unit electrically connected to the thin film transistor 120 for fingerprint identification. When the photocurrent carries fingerprint information, the fingerprint identification unit may perform identity matching on the fingerprint information to identify the identity information. During fingerprint detection, if the semiconductor layer 122 in the thin film transistor 120 is irradiated with light, a photocurrent may be generated, which may cause a short circuit of the TFT. Therefore, it is necessary to prevent the semiconductor layer 122 in the thin film transistor 120 from being irradiated with light. In this embodiment, the thin film transistor 120 includes a light shield layer 125, and the light shield layer 125 is formed over a channel region 150 between the source electrode 123 and the drain electrode 124 of the thin film transistor 120 to shield the semiconductor layer 122 exposed in the channel region 150, which may prevent light from being irradiated to the semiconductor layer 122 and effectively prevent the thin film transistor 120 from generating photocurrent. In an embodiment, in order to improve the light shield effect of the light shield layer 125, the light shield layer 125 may also shield a part of the source electrode 123 and/or a part of the drain electrode 124.

In this embodiment, since the thin film transistor 120 as the control element in the optical fingerprint sensor 100 is already provided with a light shield layer 125, when a display device with an under-screen fingerprint detection function is prepared, no additional light shield layer is required, and the preparation process is simple.

In an embodiment, the light shield layer 125 is made of metal, and the metal may be any metal. Optionally, the metal is deposited using a physical vapor deposition method, so that the light shield layer 125 may be prepared using a physical vapor deposition method, so that the preparation of the light shield layer 125 is easier. When the light shield layer 125 is made of metal, in order to prevent short circuit caused by the light shield layer 125 contacting the source electrode 123, the drain electrode 124, and the semiconductor layer 122, an insulation layer 160 is further provided between the light shield layer 125 and the semiconductor layer 122.

In an embodiment, in order to further reduce the thickness of the optical fingerprint sensor 100, optionally, the photosensor 130 includes a lower electrode 131, a gate insulation layer 140, an electrode layer 132, a dielectric layer 133 and a transparent conductive layer 134 sequentially stacked on the substrate 110, where the transparent conductive layer 134 is electrically connected to the lower electrode 131, and the electrode layer 132 is electrically connected to the source electrode 123 or the drain electrode 124 of the thin film transistor 120. Referring to FIG. 1, in this embodiment, the thin film transistor 120 includes a gate electrode 121, a gate insulation layer 140, a semiconductor layer 122 (including an intrinsic layer and a doped layer), a source electrode 123, a drain electrode 124, and a light shield layer 125. A part of the source electrode 123 or a part of the drain electrode 124 of the thin film transistor 120 is extended above the lower electrode 131 of the photosensor 130 to be configured as the electrode layer 132 of the photosensor 130. The electrode layer 132 of the photosensor 130 is a part of the source electrode 123 or the drain electrode 124 of the thin film transistor 120, so that the electrical connection between the photosensor 130 and the thin film transistor 120 is realized. It should be understood that, in FIG. 1, a part of the drain electrode 124 of the thin film transistor 120 is extended above the lower electrode 131 of the photosensor 130 and taken as the electrode layer 132 of the photosensor 130. In other embodiments, it may also be a part of the source electrode 123 of the thin film transistor 120 being extended above the lower electrode 131 of the photosensor 130 as the electrode layer 132 of the photosensor 130.

In an embodiment, the dielectric layer 133 is made of nitrogen-doped monocrystalline silicon (SiNx). Compared with the traditional PN/PIN junction sensor using lattice silicon, the dielectric layer 133 made of nitrogen-doped monocrystalline silicon as a photosensitive layer has high light absorption efficiency and light conversion efficiency, so that the detection sensitivity of the optical fingerprint sensor 100 may be improved.

In an embodiment, the transparent conductive layer 134 is made of indium tin oxide (ITO). ITO has excellent conductivity and transparency. In this embodiment, the transparent conductive layer 134 made of ITO may allow light to pass through, and then irradiate the dielectric layer 133. It is understandable that the transparent conductive layer 134 may also be made of other materials with transparency and conductivity, which is not limited in this disclosure.

Figure 2:
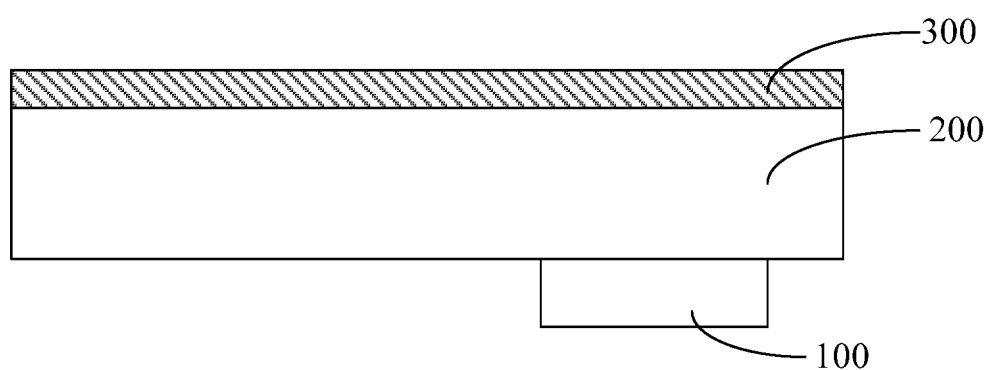
FIG. 2 is a schematic structural diagram of a display device according to an embodiment of this disclosure.

Referring to FIG. 2, based on the above embodiments, this disclosure further provides a display device including a display panel 200 and the optical fingerprint sensor 100 according to any one of the above embodiments disposed under the display panel 200. The display device may be any product or component with a display function, such as a liquid crystal panel, electronic paper, Organic Light Emitting Diode (OLED) panel, liquid crystal television, liquid crystal display, digital photo frame, mobile phone, tablet computer.

In an embodiment, the optical fingerprint sensor 100 is installed under the display panel 200. When a user presses a fingerprint on the display device, the optical fingerprint sensor 100 may collect the fingerprint through the sensor unit 10 and transmit the fingerprint information, for example, to the fingerprint identification unit for fingerprint identification, thereby realizing the function of directly performing fingerprint identification on the display device.

In an embodiment, the display device further includes a glass cover 300 disposed above the display panel 200, and the glass cover 300 is configured to protect the display panel 200.

In an embodiment, the display panel 200 includes organic light emitting diodes to meet the requirements of flexible display devices.

In an embodiment, the substrate material of the display panel 200 is glass. As the substrate of the display panel 200, glass may not only reduce the cost, but also may reduce the thickness of the entire display panel 200 because the glass is easy to thin.

In an embodiment, the substrate material of the display panel 200 may also be one of polyimide and polyethylene naphthalate. As the substrate, polyimide or polyethylene naphthalate may be configured to prepare a flexible display device, such as a flexible display screen.

Since the display device provided by this embodiment includes the optical fingerprint sensor 100 as described in any of the foregoing embodiments, it has all the technical features of the optical fingerprint sensor 100 of the foregoing embodiments, that is, it should be understood that the display device of this embodiment has all the technical features and technical effects of the optical fingerprint sensor 100 of the foregoing embodiments, and details may refer to the foregoing embodiments, which will not be repeated here.

Figure 3:
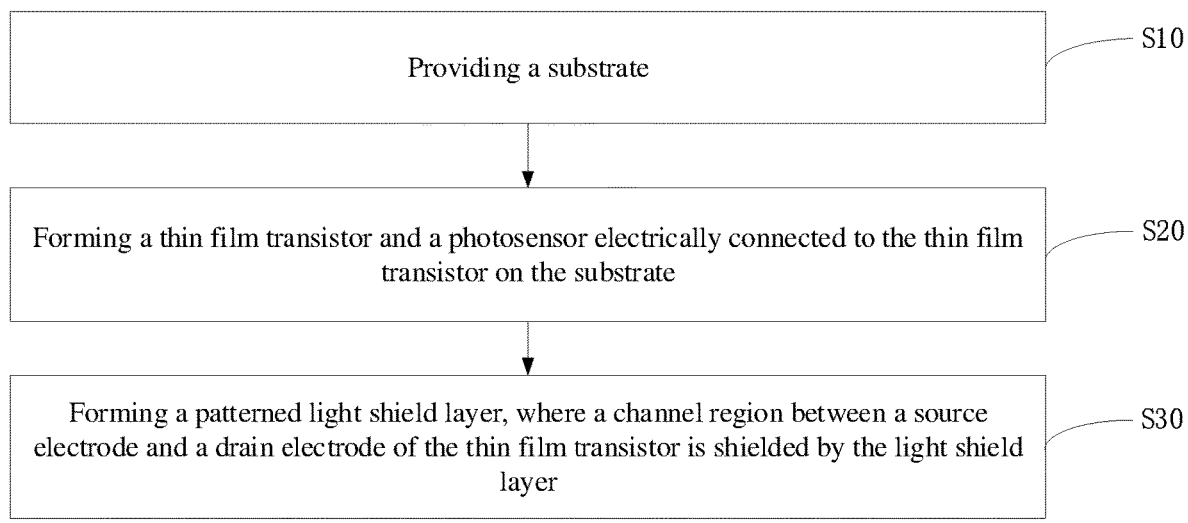
FIG. 3 is a schematic flowchart of a preparation method of an optical fingerprint sensor according to an embodiment of this disclosure.

Referring to FIG. 3, a preparation method of an optical fingerprint sensor includes:

S10: providing a substrate 110.

The substrate 110 is provided as a substrate to provide a carrying and fixing platform for the sensor unit. Before the gate electrode 121 is prepared on the substrate 110, the substrate 110 needs to be cleaned to avoid dirt on the substrate 110 from affecting the uniformity of the deposition or causing pollution in the subsequent deposition process.

S20: forming a thin film transistor and a photosensor electrically connected to the thin film transistor on the substrate.

In this embodiment, the thin film transistor 120 and the photosensor 130 electrically connected to the thin film transistor 120 formed on the substrate 110 may be conventional thin film transistor and conventional photosensor, which are not specifically limited herein.

Figure 4:
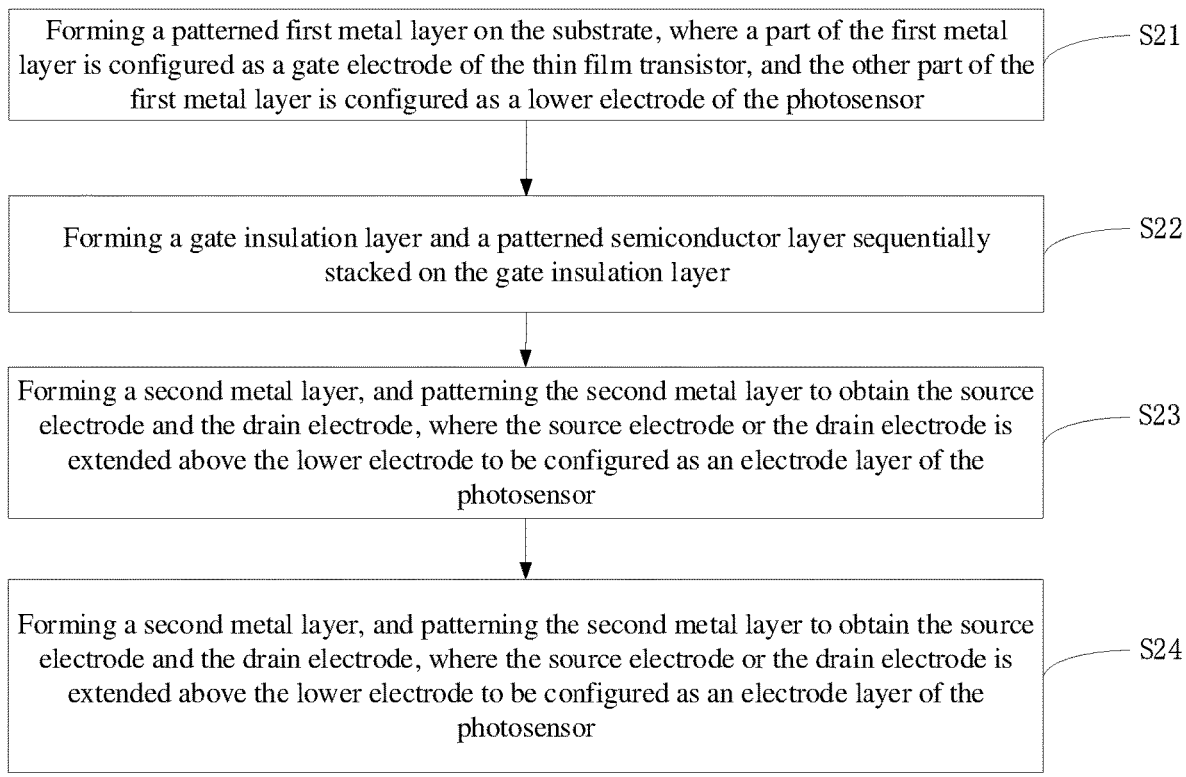
FIG. 4 is a detailed flowchart of S20 in FIG. 3.

Optionally, as shown in FIG. 4, FIG. 4 is a detailed flowchart of S20 in this embodiment. Forming a thin film transistor and a photosensor electrically connected to the thin film transistor on the substrate may include S21~S24 as follows.

S21: forming a patterned first metal layer on the substrate, where a part of the first metal layer is configured as a gate electrode of the thin film transistor, and the other part of the first metal layer is configured as a lower electrode of the photosensor.

A first metal layer is deposited on the cleaned substrate 110. Optionally, the first metal layer may be deposited by physical vapor deposition. Optionally, the first metal layer is made of at least one of copper, aluminum and molybdenum. Then a layer of photoresist is coated on the first metal layer, and a mask corresponding to the first metal layer is applied to expose the photoresist. The exposed photoresist is developed and wet etched with etchant, and then the substrate 110 is put into a stripping solution to strip off the photoresist, so that the first metal layer is prepared to obtain the gate electrode 121 of the thin film transistor 120 and the lower electrode 131 of the photosensor 130. For details, refer to A diagram in FIG. 5.

S22: forming a gate insulation layer and a patterned semiconductor layer sequentially stacked on the gate insulation layer.

After the patterned first metal layer is prepared, the substrate 110 with the first metal layer is cleaned, a thin film of the gate insulation layer 140 is deposited on the substrate 110, then the substrate 110 is cleaned again, and then thin film of the semiconductor layer 122 (including an intrinsic layer and a doped layer) is deposited on the substrate 110. Optionally, thin film of the gate insulation layer 140 and thin film of the semiconductor layer 122 may be deposited using a chemical vapor deposition method. Then a layer of photoresist is coated on the thin film of the semiconductor layer, a mask corresponding to the semiconductor layer is applied to expose the photoresist, the exposed photoresist is developed and wet etched with etchant, and then the substrate 110 is put into a stripping solution. After stripping off the photoresist, the semiconductor layer 122 is obtained. For the structures of the gate insulation layer 140 and the semiconductor layer 122 prepared in this step, refer to B diagram in FIG. 5 for details. The gate insulation layer 140 is configured to isolate the gate electrode 121 and the semiconductor layer 122 to prevent the gate electrode 121 and the semiconductor layer 122 from being connected and short-circuited.

S23: forming a second metal layer, and patterning the second metal layer to obtain the source electrode and the drain electrode, where the source electrode or the drain electrode is extended above the lower electrode to be configured as an electrode layer of the photosensor.

The substrate 110 on which the semiconductor layer 122 has been deposited is cleaned, and then a second metal layer is deposited on the semiconductor layer 122. The substrate 110 on which the second metal layer is deposited is taken out, and then a layer of photoresist is coated. A mask corresponding to the second metal layer is applied to expose the photoresist, and after development, etchant is applied to wet etch the source and drain metal layer, and then the substrate 110 is placed in a stripping solution, and the photoresist is stripped to obtain the source electrode 123 and the drain electrode 124. For the prepared source electrode 123 and drain electrode 124, refer to C diagram in FIG. 5 for details. The source electrode 123 or the drain electrode 124 is extended above the lower electrode 131 to be configured as the electrode layer 132 of the photosensor 130. It should be understood that, in C diagram in FIG. 5, the drain electrode 124 is extended above the lower electrode 131 to be configured as the electrode layer 132 of the photosensor 130. In other embodiments, the source electrode 123 may be extended above the lower electrode 131 to be configured as the electrode layer 132 of the photosensor 130.

After the patterned second metal layer is prepared, the substrate 110 is cleaned, and then thin film of an insulation layer is deposited on the substrate 110. Then a layer of photoresist is coated, and the photoresist is exposed using a mask. After development, the thin film of the insulation layer is wet etched with etchant, and then the substrate 110 is placed in the stripping solution, and the photoresist is stripped to obtain a patterned insulation layer 160. For the prepared patterned insulation layer 160, refer to D diagram in FIG. 5 for detail. The insulation layer 160 defines a first via 170 and a second via 180. The first via 170 is located vertically above the lower electrode to expose the source electrode 123 or the drain electrode 124 over the lower electrode 131, and the exposed source electrode 123 or the drain electrode 124 is configured as the electrode layer 132 of the photosensor 130. The second via 180 exposes a part of the lower electrode 131.

S24: forming a patterned dielectric layer and a patterned transparent conductive layer sequentially stacked on the electrode layer, where the transparent conductive layer is covered on dielectric layer and connected to the lower electrode, the thin film transistor includes the gate electrode, the gate insulation layer, the semiconductor layer, the source electrode, and the drain electrode, and the photosensor includes the lower electrode, the gate insulation layer, the electrode layer, and the dielectric layer and the transparent conductive layer.

Specifically, after cleaning the substrate 110 after the above-mentioned treatment, thin film of the dielectric layer 133 is deposited on the substrate 110. Optionally, the thin film of the dielectric layer 133 is made of nitrogen-doped amorphous silicon (SiNx). Then a layer of photoresist is coated, and a mask corresponding to the dielectric layer 133 is applied to expose the photoresist. After development, the thin film of the dielectric layer 133 is wet etched with etchant to obtain the dielectric layer 133. Referring to E diagram in FIG. 5, the dielectric layer 133 is covered on the electrode layer 132.

Then the substrate 110 is cleaned, and a thin film of the transparent conductive layer is deposited on the substrate 110. Optionally, the thin film of the transparent conductive layer is made of ITO. Then, a layer of photoresist is coated, and a mask corresponding to the transparent conductive layer is applied to expose the photoresist. After development, the thin film of the transparent conductive layer is wet etched with etchant to obtain a transparent conductive layer 134. Referring to F diagram in FIG. 5, the transparent conductive layer 134 is covered on the dielectric layer 133 and is connected to the exposed lower electrode 131.

S30: forming a patterned light shield layer, where a channel region between a source electrode and a drain electrode of the thin film transistor is shielded by the light shield layer.

After cleaning the substrate 110 with the thin film transistor 120 and the photosensor 130, thin film of the light shield layer is deposited on the substrate 110. Optionally, the light shield film may be made of any metal. Then, a layer of photoresist is coated, and a mask corresponding to the light shield layer is applied to expose the photoresist. After development, the thin film of the light shield layer is wet etched with etchant to obtain a light shield layer 125. Referring to G diagram of FIG. 5, the light shield layer 125 shields the channel region 150 between the source electrode 123 and the drain electrode 124 of the thin film transistor 120 to prevent the semiconductor layer 122 exposed in the channel region 150 from being irradiated by light.

Figure 5:
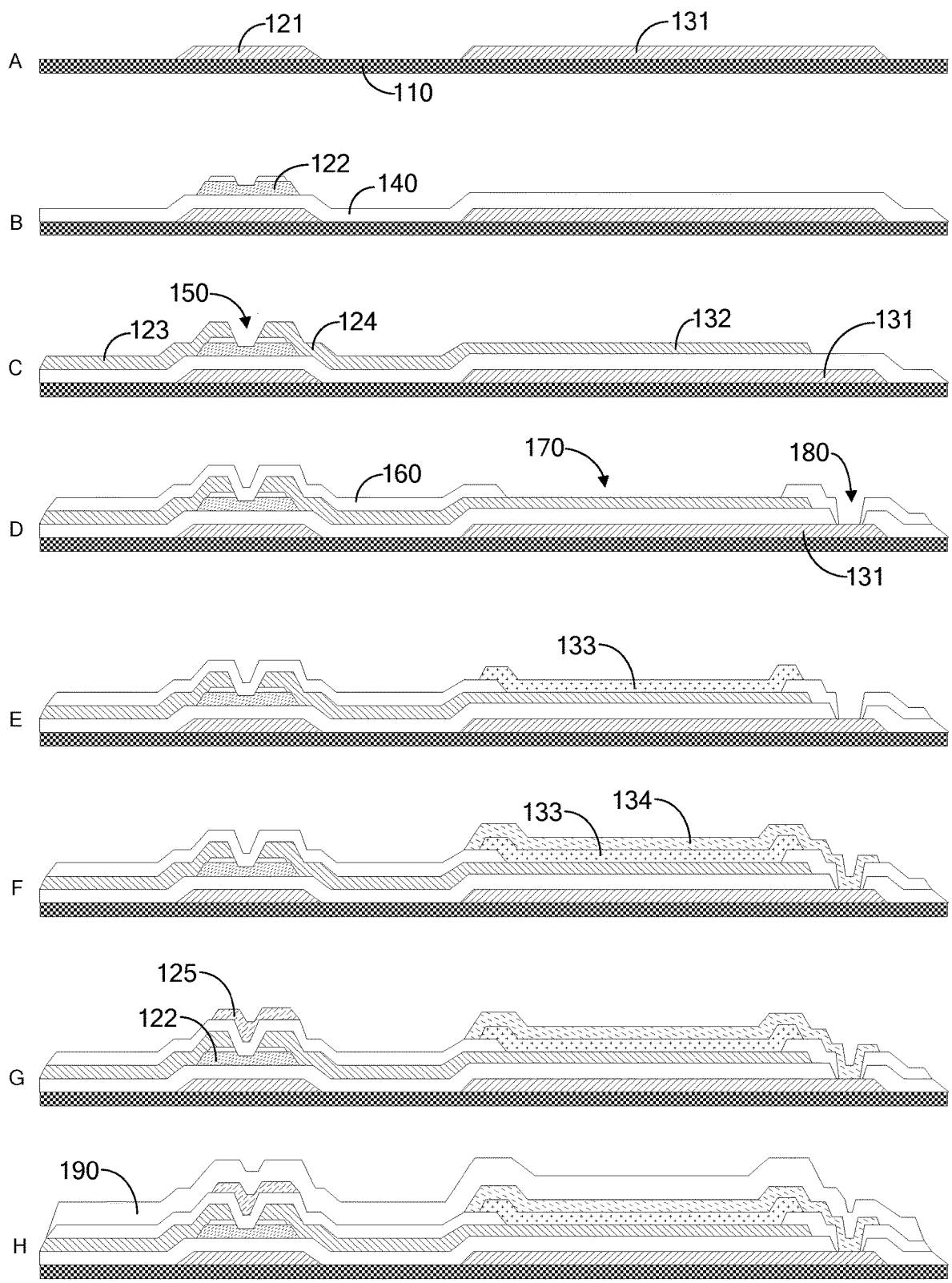
FIG. 5 is a schematic diagram of a preparation process of the optical fingerprint sensor using the method of FIG. 3.

In an embodiment, referring to H diagram in FIG. 5, an insulation protective layer 190 may be deposited on the optical fingerprint sensor 100 with the light shield layer 125, and the insulation protective layer 190 is made of a transparent insulation material.

The above are only optional embodiments of this disclosure and do not limit the patent scope of this disclosure. Any equivalent structure or equivalent process transformation made by the description and drawings of this disclosure, or directly or indirectly used in other related technical fields are similarly included in the patent protection scope of this disclosure.

What is claimed is:
1. An optical fingerprint sensor, comprising:
a substrate; and a sensor unit, disposed on the substrate and comprising a thin film transistor and a photosensor electrically connected to the thin film transistor, wherein the thin film transistor comprises a source electrode, a drain electrode, a semiconductor layer, and a light shield layer formed over a channel region between the source electrode and the drain electrode and shielding the semiconductor layer exposed in the channel region;

wherein the photosensor comprises a lower electrode, a gate insulation layer, an electrode layer, a dielectric layer and a transparent conductive layer sequentially stacked on the substrate, wherein the transparent conductive layer is electrically connected to the lower electrode, and the electrode layer is electrically connected to the source electrode or the drain electrode of the thin film transistor.

2. The optical fingerprint sensor of claim 1, wherein a part of the source electrode or a part of the drain electrode is shielded by the light shield layer.

3. The optical fingerprint sensor of claim 1, wherein the light shield layer is made of metal.

4. The optical fingerprint sensor of claim 3, wherein the light shield layer is prepared by a physical vapor deposition method.

5. The optical fingerprint sensor of claim 3, further comprising an insulation layer between the light shield layer and the semiconductor layer.

6. The optical fingerprint sensor of claim 1, wherein a part of the source electrode or a part of the drain electrode of the thin film transistor is extended above the lower electrode of the photosensor to be configured as the electrode layer of the photosensor.

7. The optical fingerprint sensor of claim 1, wherein a material of the transparent conductive layer comprises indium tin oxide.

8. The optical fingerprint sensor of claim 1, wherein a material of the dielectric layer comprises nitrogen-doped amorphous silicon.

9. The optical fingerprint sensor of claim 1, wherein a material of the substrate comprises glass.

10. The optical fingerprint sensor of claim 9, wherein a thickness of the substrate is not greater than 1 mm.

11. The optical fingerprint sensor of claim 1, further comprising an insulation protective layer deposited on the light shield layer.

12. A display device, comprising a display panel and the optical fingerprint sensor as recited in claim 1 arranged under the display panel.

13. A preparation method of an optical fingerprint sensor the optical fingerprint sensor comprising:

a substrate; and a sensor unit, disposed on the substrate and comprising a thin film transistor and a photosensor electrically connected to the thin film transistor, wherein the thin film transistor comprises a source electrode, a drain electrode, a semiconductor layer, and a light shield layer formed over a channel region between the source electrode and the drain electrode and shielding the semiconductor layer exposed in the channel region, wherein the preparation method comprises:

providing the substrate;

forming the thin film transistor and the photosensor electrically connected to the thin film transistor on the substrate; and forming a patterned light shield layer, wherein the channel region between the source electrode and the drain electrode of the thin film transistor is shielded by the light shield layer;

wherein forming the thin film transistor and the photosensor electrically connected to the thin film transistor on the substrate comprises:

forming a patterned first metal layer on the substrate, wherein a part of the first metal layer is configured as a gate electrode of the thin film transistor, and the other part of the first metal layer is configured as a lower electrode of the photosensor;

forming a gate insulation layer and a patterned semiconductor layer sequentially stacked on the gate insulation layer;

forming a second metal layer, and patterning the second metal layer to obtain the source electrode and the drain electrode, wherein the source electrode or the drain electrode is extended above the lower electrode to be configured as an electrode layer of the photosensor; and forming a patterned dielectric layer and a patterned transparent conductive layer sequentially stacked on the electrode layer, wherein the transparent conductive layer is covered on dielectric layer and connected to the lower electrode, the thin film transistor comprises the gate electrode, the gate insulation layer, the semiconductor layer, the source electrode, and the drain electrode, and the photosensor comprises the lower electrode, the gate insulation layer, the electrode layer, and the dielectric layer and the transparent conductive layer.

14. The display device of claim 12, wherein a substrate of the display panel is made of at least one of glass, polyimide and polyethylene naphthalate.

* * * * *

UNITED STATES PATENT AND TRADEMARK OFFICE
CERTIFICATE OF CORRECTION

| | |
|---|---|
| PATENT NO. | : 11,562,596 B2 |
| APPLICATION NO. | : 17/218481 |
| DATED | : January 24, 2023 |
| INVENTOR(S) | : En-tsung Cho et al. |

It is certified that error appears in the above-identified patent and that said Letters Patent is hereby corrected as shown below:

On the Title Page

Item [73], Assignees, change "BEIHAI HKG OPTOELECTRONICS TECHNOLOGY CO., LTD." to --BEIHAI HKC OPTOELECTRONICS TECHNOLOGY CO., LTD.--

Signed and Sealed this
Twenty-first Day of March, 2023

Katherine Kelly Vidal
*Director of the United States Patent and Trademark Office*